United States Patent
Kishi

[11] Patent Number: 5,985,722
[45] Date of Patent: Nov. 16, 1999

[54] METHOD OF FABRICATING ELECTROSTATIC DISCHARGE DEVICE

[75] Inventor: Shuuji Kishi, Toyko, Japan

[73] Assignee: NEC Corporation, Tokyo, Japan

[21] Appl. No.: 08/910,247

[22] Filed: Aug. 13, 1997

[30] Foreign Application Priority Data

Aug. 26, 1996 [JP] Japan .................................. 8-223766

[51] Int. Cl.$^6$ ............................................. H01L 21/8234
[52] U.S. Cl. ........................ 438/275; 438/200; 438/305; 438/306; 438/307; 438/233; 438/583; 257/356
[58] Field of Search ..................... 438/275, 305, 438/306, 307, 583, 200, 233, FOR 168, FOR 188, FOR 216, FOR 217, FOR 218; 257/356

[56] References Cited

U.S. PATENT DOCUMENTS

| | | | |
|---|---|---|---|
| 4,931,411 | 6/1990 | Tigelaar et al. | 438/275 |
| 5,262,344 | 11/1993 | Mistry | 437/57 |
| 5,585,299 | 12/1996 | Hsu | 438/275 |
| 5,654,239 | 8/1997 | Sakamoto | 438/491 |
| 5,656,546 | 8/1997 | Chen et al. | 438/586 |
| 5,672,527 | 9/1997 | Lee | 437/56 |
| 5,792,684 | 8/1998 | Lee et al. | 438/238 |
| 5,804,470 | 9/1998 | Wollesen | 438/141 |

FOREIGN PATENT DOCUMENTS

| | | | |
|---|---|---|---|
| 61-043464 | 3/1986 | Japan . | |
| 363114211 | 5/1988 | Japan | 438/FOR 360 |
| 401166540 | 6/1989 | Japan | 438/FOR 360 |
| 1-259560 | 10/1989 | Japan . | |
| 402027727 | 1/1990 | Japan | 438/FOR 360 |
| 2271674 | 11/1990 | Japan . | |
| 404071236 | 3/1992 | Japan | 438/FOR 360 |
| 4-234162 | 8/1992 | Japan . | |
| 7106567 | 4/1995 | Japan . | |
| 7142589 | 6/1995 | Japan . | |
| 9199720 | 7/1997 | Japan . | |

*Primary Examiner*—George Fourson
*Assistant Examiner*—Long Pham
*Attorney, Agent, or Firm*—Foley & Lardner

[57] ABSTRACT

There is provided a semiconductor device including a transistor, said transistor having (a) a semiconductor substrate, (b) source and drain regions formed in the semiconductor substrate, (c) a gate electrode formed on the semiconductor substrate between the source and drain regions, (d) a silicide layer formed partially on one of the source and drain regions, and (e) an electrode terminal making contact with the silicide layer. The silicide layer extends so that it covers at least an area through which the electrode terminal makes contact with the drain region. In the above mentioned semiconductor device, since the silicide layer is formed only in the vicinity of an area through which the electrode terminal makes contact with the silicide layer, it is possible to construct an output transistor in LDD structure. Thus, there can be obtained an output transistor having higher ESD immunity, higher driving ability, and higher integration. In particular, comparing to a conventional output transistor having the same driving ability, but not having a silicide layer, it could be possible to reduce a device area by 10% or more, ensuring avoidance from an increase in fabrication cost caused by increased chip size.

4 Claims, 4 Drawing Sheets

1

METHOD OF FABRICATING ELECTROSTATIC DISCHARGE DEVICE

BACKGROUND OF THE INVENTION

1. Field of the Invention

The invention relates to an output transistor having resistance against electro static discharge (hereinafter, referred to simply as "ESD").

2. Description of the Related Art

There has been used metal-silicidation in CMOS and BiCMOS devices for reducing a diffusion layer resistance and a gate resistance to thereby ensure operation at a higher speed and higher integration. For instance, a layer resistance of a diffusion layer can be reduced down to one thirtieth by metal-silicidation, specifically from 200–300 $\Omega/\square$ to 5–10 $\Omega/\square$. Hence, an operation speed or an integration density is improved by about 20% in comparison with devices to which metal-silicidation is not applied. If a particular layout is used, the improvement could reach about 60%, which means that metal-silicidation is quite useful for enhancing operation speed.

The latest MOS devices need to have a lightly doped drain (LDD) structure which is helpful for fabricating a device in smaller size. In LDD structure, source and drain region diffusion layers are designed to include diffusion layers having a lower impurity concentration in the vicinity of a gate electrode. Specifically, the diffusion layers have an impurity concentration one or two smaller in order than that of a usual diffusion layer. The LDD structure reduces influence by hot carriers which is accompanied with a channel length being shortened. Thus, the latest MOS transistors adopt both the metal-silicidation and LDD structure to thereby ensure a higher operation speed and higher integration.

Hereinbelow is explained ESD phenomenon with reference to FIGS. 1 and 2. FIG. 1 is a circuit diagram of a circuit doubling as an output transistor and an output protection circuit, and FIG. 2 is a cross-sectional view of a device corresponding to the circuit illustrated in FIG. 1. FIG. 2 illustrates CMOS transistor including a silicide and LDD structure. In the illustrated CMOS transistor, PMOS transistor is formed in a device region defined by p-type impurity region comprising p+ diffusion layers 6A and 7A and p– diffusion layers 6B and 7B, and an n-type well 3, and NMOS transistor is formed in a device region defined by n-type impurity region comprising n+ diffusion layers 8A and 9A and n– diffusion layers 8B and 9B, and a p-type silicon substrate 1. The layers 6B, 7B, 8B and 9B are all LDD layers. A silicide layer 13 entirely covers the p+ diffusion layers 6A, 7A and n+ diffusion layers 8A, 9A therewith. The source diffusion layer 7A of PMOS transistor is in electrical connection with a electric power source line Vdd through a source electrode 15C, and similarly, the source diffusion layer 8A of NMOS transistor is in electrical connection with a ground line GND through a source electrode 15A, and the drain diffusion layers 6A and 9A of PMOS and NMOS transistors are in electrical connection with an output terminal OUT through a drain electrode 15B. A gate of PMOS transistor is in electrical connection with the power source line Vdd, and a gate of NMOS transistor is in electrical connection with the ground line GND.

In ESD evaluation, four kinds of breakdown voltages at which a device is destroyed is tested by electrically connecting an ESD testing kit to the output terminal OUT, and applying static electricity which is positive (+) and negative (−) relative to a voltage at Vdd or GND, to the output terminal.

Hereinbelow, how a current flows when static electricity is applied to the output terminal OUT is explained with reference to FIG. 2. For instance, when static electricity positive relative to the ground line GND is applied to the output terminal OUT, an NPN type parasitic bipolar transistor defined by the drain diffusion layer 9A, the p-type substrate 1 and the source diffusion layer 8A of the NMOS transistor is turned on. That is, since a positive electricity is applied to the drain diffusion layer 9A acting as a collector, a reverse bias is applied to the transistor. At this time, since static electricity reaches hundreds of to thousands of volts, a breakdown takes place at a pn junction, and accordingly a current flows. The current raises a base voltage to thereby turn the NPN parasitic bipolar transistor on. Thus, the current flows from the source diffusion layer 8A to the ground line GND.

When static electricity negative relative to the ground line GND is applied to the output terminal OUT, a forward bias is applied to a diode defined by the drain diffusion layer 9A and the p-type substrate 1. Thus, the diode is turned on, and hence a current flows from the p-type substrate 1 to the output terminal OUT through the drain diffusion layer 9A.

A phenomenon which would take place when static electricity positive or negative relative to the power source line Vdd is applied to the output terminal OUT is the same as the above mentioned phenomenon except that the NPN parasitic bipolar transistor is replaced with PNP parasitic bipolar transistor. Hence, explanation is not made.

Herein, it should be noted that the parasitic bipolar transistor has a lateral structure. Hence, immediately after a voltage has been applied, a diffusion layer as a whole does not act as a collector, and thus is locally turned on. As a current is increased, on-state spreads over the entirety of a diffusion layer. Accordingly, the parasitic bipolar transistor needs to consider as an aggregate of a plurality of lateral transistors Tr1 to Trx having different base width, as illustrated in FIG. 2. The ESD immunity is dependent on how the on-state is dispersed in a diffusion layer when a voltage is applied thereto. The reason is as follows. If a current were concentrated into a certain lateral transistor, electric breakdown would take place in the lateral transistor. Accordingly, the ESD immunity could be obtained by propagating the on-state to all the other lateral transistors, if one of lateral transistors is turned on, to thereby avoid local concentration of current.

When MOS transistor having LDD and silicide as mentioned above is used as an output transistor, silicide might be a cause to lower the ESD immunity. For instance, suppose that there is not formed the silicide layer 13 in the NMOS transistor illustrated in FIG. 2, even if a positive static electricity is applied to the output terminal OUT, the concentration of current would not take place, because a diffusion layer has a high resistance. Hence, it is possible to have high ESD immunity. In contrast, when there is formed the silicide layer 13 as illustrated in FIG. 2, a voltage applied to the output terminal OUT could instantaneously reach the LDD layer 9B without a voltage drop. Since the LDD layer 9B has a low impurity concentration, the parasitic bipolar transistor Tr1 is first made to turn on among all the diffusion layers, and hence a current flows in the transistor Tr1. However, since a collector resistance is quite high and hence much heat is generated there, the parasitic bipolar transistor Tr1 is destroyed before the subsequent parasitic bipolar transistors Tr2 to Trx are made to turn on.

Hereinbelow is shown the results on ESD evaluation relating to presence or absence of silicide. Electric charge is charged into a capacitor having a capacity of 100 pF through a resistor of 1.5 kΩ, and is connected to the output terminal OUT. In this arrangement, deterioration in performance of an output transistor has been observed before and after discharge of the capacity. It has been found that the ESD immunity of about −4000V could be maintained in diode operation regardless of presence or absence of silicide. In contrast, the circuit which could maintain the ESD immunity of about +4000V without silicide in parasitic bipolar transistor operation was destroyed at about +1000V by forming silicide therein. As is obvious from the above mentioned results, the ESD immunity of an output transistor is significantly concerned with the operation of a parasitic bipolar transistor.

In order to solve the above mentioned problem, a conventional semiconductor device has been designed to have MOS transistor including both silicide and LDD for an internal circuit thereof, taking integration and so on into consideration, and have another MOS transistor including no silicide for an output transistor, to thereby have the ESD immunity.

As mentioned earlier, when MOS transistor including LDD and silicide, as illustrated in FIG. 2, is used as an output transistor, there arises a problem that the ESD immunity is lowered, and hence the transistor is easily destroyed by static electricity.

In order to solve this problem, a conventional semiconductor device has been designed in such a manner that an output transistor thereof is not formed with silicide to have the ESD immunity. However, since an output transistor is a device for driving an external circuit, it is required to have a driving ability as well as the ESD immunity. As mentioned earlier, presence or absence of silicide makes a difference of about 20% in driving ability of MOS transistor. Thus, in order to satisfy a certain driving ability required, a transistor having no silicide has to be larger in size by 20% or more than a transistor having silicide. This is accompanied with an increase in cost in accordance with chip size.

Many methods have been suggested to fabricate a semiconductor device in which only output transistor has no silicide. However, such methods have excessive fabrication steps, which deteriorates a yield of fabrication. Specifically, a transistor used for an internal circuit is separately formed from an output transistor in the above mentioned methods. Hence, those methods have to have a step of forming source and drain diffusion layers of an output transistor with an internal circuit being covered with a mask, and some of those methods may need to further have a step of removing silicide formed on diffusion layers of an output transistor.

As a simple solution to the above mentioned problem, a transistor may be made larger in size with silicide being as it is, to thereby enhance resistance against destruction of a parasitic bipolar transistor in LDD layers. However, it has been confirmed in view of the experiments that a gate width has to be made two times longer or greater in order to have a certain ESD immunity. Thus, the above mentioned simple solution is accompanied with a problem of an increase in size of a transistor.

Japanese Unexamined Patent Publication No. 1-259560 has suggested a semiconductor integrated circuit device which includes an input and output protection circuit, an internal circuit, and a silicide layer formed on diffusion regions and polysilicon layers of the internal circuit. The silicide layer is not formed in diffusion regions of the input and output protection circuit.

Japanese Unexamined Patent Publication No. 4-234162 has suggested a semiconductor device including a semiconductor substrate having first electrical conductivity, a shallow junction region formed in the semiconductor substrate and having a certain depth and second electrical conductivity, a low-resistive wiring layer formed on the semiconductor substrate with an insulating layer sandwiched therebetween, said wiring layer being electrical connection with both the shallow junction region through contact holes formed throughout the insulating layer and an output terminal, and a deep junction region formed in the semiconductor substrate and having second electrical conductivity, said deep junction region having a region including a contact region in the shallow junction region, and also having a depth sufficient to surround junction destroyed portion generated, due to static electricity applied to the output terminal, in the semiconductor substrate through a contact portion of the low-resistive wiring layer and the shallow junction region.

SUMMARY OF THE INVENTION

It is an object of the present invention to provide a semiconductor device including a transistor having higher ESD immunity, higher speed in operation, and higher integration.

In one aspect, there is provided a semiconductor device including a transistor comprising a source region, a drain region, and a gate electrode formed between the source and drain regions, the semiconductor device further including (a) silicide layers formed on both the source and drain regions, (b) source and drain electrode terminals making electrical connection with the silicide layer. A spacing between an end of the silicide layer formed on one of the source and drain regions, situated closer to the gate electrode, and an end of the gate electrode is set greater than a spacing between an end of the silicide layer formed on the other of the source and drain regions, situated closer to the gate electrode, and the other end of the gate electrode.

It is preferable that the source electrode terminal is in electrical connection with a power source, and the drain electrode terminal is in electrical connection with an output terminal. It is also preferable that the drain region has LDD structure including a first diffusion layer and a second diffusion layer having a greater impurity concentration than that of the first diffusion layer.

There is further provided a semiconductor device including a transistor, the transistor including (a) a semiconductor substrate, (b) field insulating films formed on a surface of the semiconductor substrate, (c) source and drain regions formed in the semiconductor substrate between the field insulating films, (d) a gate electrode formed on the semiconductor substrate between the source and drain regions, and (e) a silicide layer formed on one of the source and drain regions, the silicide layer extending from the field insulating film to a point spaced away from an end of the gate electrode.

The transistor may further include an insulating film covering the gate electrode, and the drain region between the end of the gate electrode and the point. The transistor may further include a second silicide layer entirely covering the other of the source and drain regions therewith.

There is still further provided a semiconductor device including a transistor, the transistor including (a) a semiconductor substrate, (b) source and drain regions formed in the semiconductor substrate, (c) a gate electrode formed on the semiconductor substrate between the source and drain regions, (d) a silicide layer formed partially on one of the source and drain regions, and (e) an electrode terminal making contact with the silicide layer. The silicide layer extends so that it covers at least an area through which the electrode terminal makes contact with the silicide layer.

The transistor may further include field insulating films formed on the semiconductor substrate, between which the source and drain regions are formed, the silicide layer extending from the area to the field insulating film. The transistor may further include an insulating film covering the gate electrode, and the drain region between an end of the gate electrode and the area. The transistor may further include a second silicide layer entirely covering the other of the source and drain regions therewith. The transistor may further include a second electrode terminal making contact with the second silicide layer, the electrode terminal making electrical contact with an output terminal and the second electrode terminal making electrical contact with a power supply.

There is yet further provided a semiconductor device including PMOS and NMOS transistors, each of the PMOS and NMOS transistors including (a) source and drain regions formed in a semiconductor substrate, (b) a gate electrode formed on the semiconductor substrate between the source and drain regions, (c) a silicide layer formed partially on one of the source and drain regions, and (d) an electrode terminal making contact with the silicide layer. The silicide layer extends so that it covers at least an area through which the electrode terminal makes contact with the silicide layer.

The semiconductor device may further include field insulating films formed on the semiconductor substrate, between which the PMOS and NMOS transistors are formed, the silicide layer extending from the area to the field insulating film. It is preferable that each of the PMOS and NMOS transistors further include an insulating film covering the gate electrode, and the drain region between an end of the gate electrode and the area. It is also preferable that each of the PMOS and NMOS transistors further includes a second silicide layer entirely covering the other of the source and drain regions therewith.

In another aspect, there is provided a method of fabricating a semiconductor device, including the steps of (a) forming a transistor in a semiconductor substrate, the transistor including a source region, a lightly doped drain region, and a gate electrode formed between the source and drain regions in electrical insulation, and (b) forming a silicide layer partially covering one of the source and drain regions therewith. The method may further include the step of (c) forming an insulating film extending from the gate electrode and partially covering the one of the source and drain regions therewith. The step (c) is carried out between the steps (a) and (b).

The silicide layer may be formed in the step (b) so that it partially covers one of the source and drain regions therewith and entirely covers the other of the source and drain regions therewith.

There is further provided a method of fabricating a semiconductor device, including the steps of (a) forming a transistor in a semiconductor substrate, the transistor including a source region, a drain region, and a gate electrode formed between the source and drain regions in electrical insulation, (b) forming a silicide layer partially covering one of the source and drain regions therewith, and (c) forming an electrode terminal making contact with the silicide layer, the silicide layer extending so that it covers at least an area through which the electrode terminal makes contact with the drain region.

The above mentioned method may further include the step of (d) forming an insulating film extending from the gate electrode and partially covering the one of the source and drain regions therewith, the silicide layer being formed extending from an end of the insulating film. The step (d) is carried out between the steps (a) and (b).

There is still further provided a method of fabricating a semiconductor device including an internal transistor and one of input and output transistors, including the steps of (a) forming a transistor simultaneously in each of device regions for the internal transistor and the one of input and output transistors, the transistor including a source region, a drain region, and a gate electrode formed between the source and drain regions in electrical insulation, and (b) forming a silicide layer partially covering one of the source and drain regions of the one of input and output transistors, and entirely covering both the other of the source and drain regions of the one of input and output transistors and the source and drain regions of the internal transistor.

The above mentioned method may further include the step of (c) forming an insulating film extending from the gate electrode and partially covering the one of the source and drain regions of the one of input and output transistors therewith. The step (c) is carried out between the steps (a) and (b).

There is yet further provided a method of fabricating a semiconductor device including an internal transistor and one of input and output transistors, including the steps of (a) forming a transistor simultaneously in each of device regions for the internal transistor and the one of input and output transistors, the transistor including a source region, a drain region, and a gate electrode formed between the source and drain regions in electrical insulation, (b) forming a silicide layer partially covering one of the source and drain regions of the one of input and output transistors, and entirely covering both the other of the source and drain regions of the one of input and output transistors, and the source and drain regions of the internal transistor, and (c) forming an electrode terminal making contact with the silicide layer, the silicide layer extending so that it covers at least an area through which the electrode terminal makes contact with the drain region.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
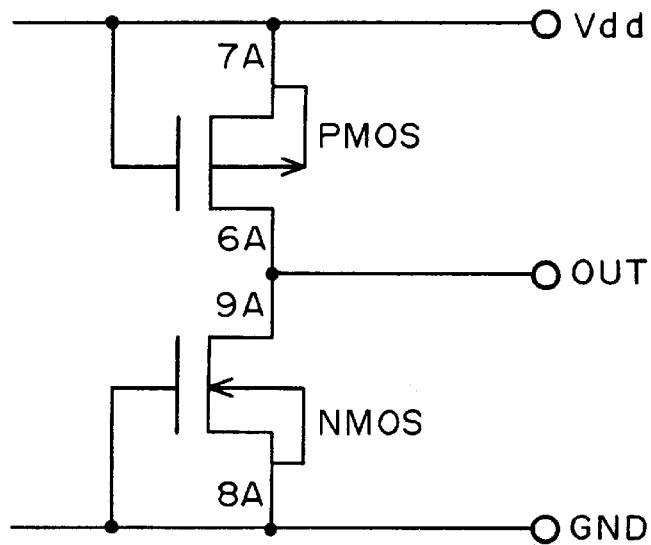
FIG. 1 is a circuit diagram of an output transistor.
Figure 2:
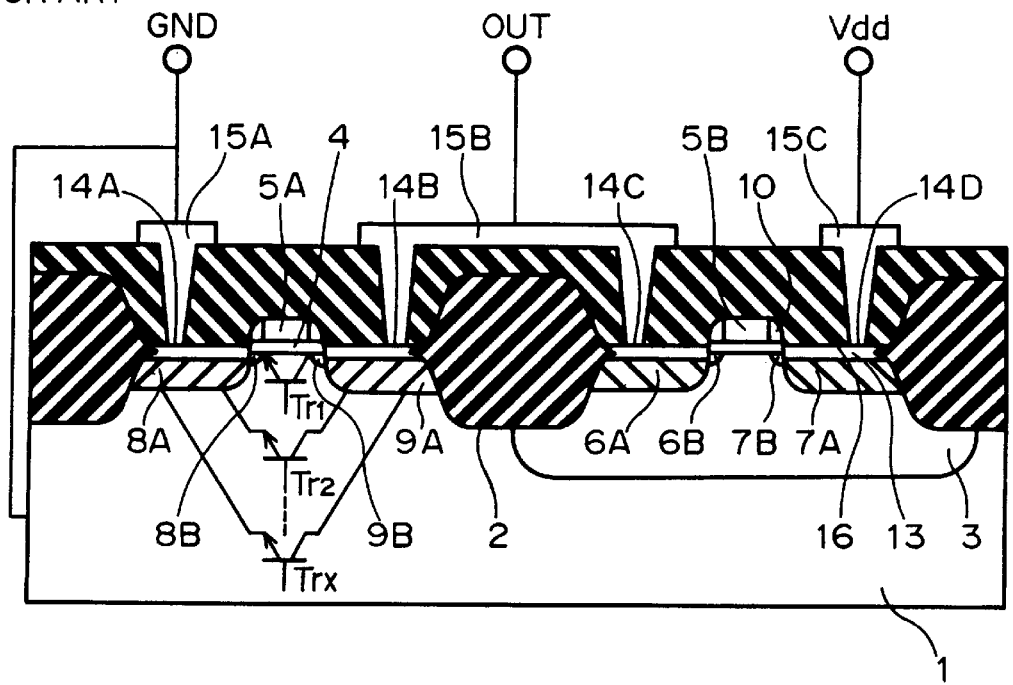
FIG. 2 is a cross-sectional view of MOS transistor having a silicide layer entirely on diffusion layers.
Figure 3:
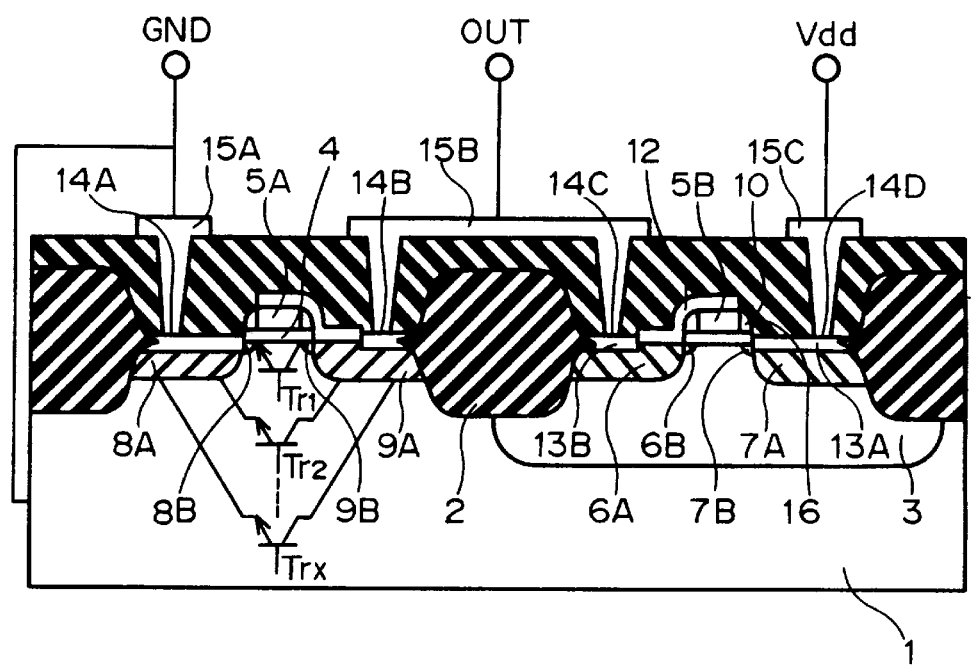
FIG. 3 is a cross-sectional view of MOS transistor in accordance with the present invention.
Figure 4:
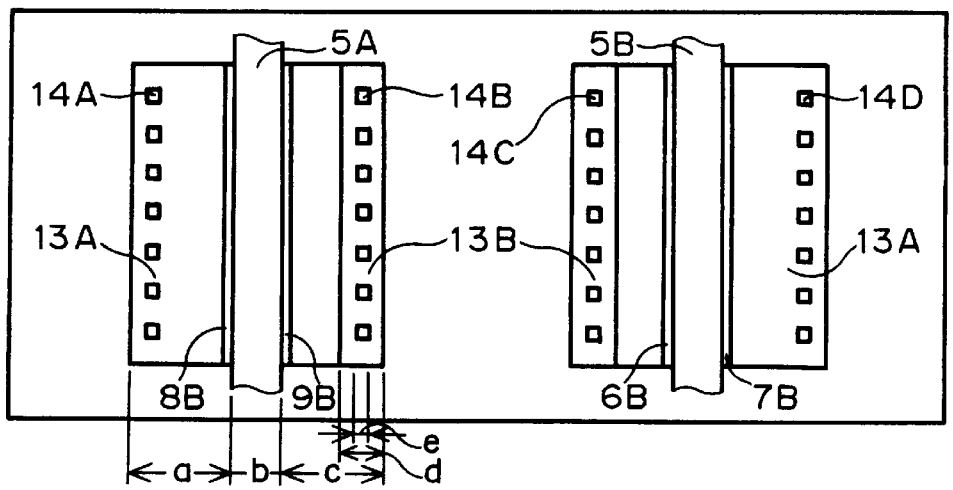
FIG. 4 is a plan view of MOS transistor illustrated in FIG. 3.

With reference to FIGS. 3 and 4, an output transistor in accordance with the present invention is explained hereinbelow. In FIGS. 3 and 4, parts corresponding to those of FIG. 2 have been provided with the same reference numerals.

With reference to FIG. 3, the illustrated output transistor includes a p-type silicon substrate 1, field oxide films 2 formed at a surface of the silicon substrate 1, an n-type well 3 formed in the silicon substrate 1 between the field oxide films 2, p+ diffusion layers 6A, 7A formed in the silicon substrate 1 in a device formation region defined by the adjacent field oxide films 2, and n+ diffusion layers 8A, 9A formed in the silicon substrate 1 in a device formation region defined by the adjacent field oxide films 2. The diffusion layers 6A and 9A act as drain, and the diffusion layers 7A and 8A act as source. There are also formed p– diffusion layers 6B, 7B and n– diffusion layers 8B, 9B adjacent to the diffusion layers 6A, 7A, 8A and 9A, respectively.

On surface of the p-type silicon substrate 1 are formed gate oxide films 4 between the diffusion layers 6A and 7A and also between the diffusion layers 8A and 9A. Gate electrodes 5A and 5B are formed on the gate oxide films 4. The gate electrodes 5A and 5B are surrounded around their sidewalls with sidewall insulating films 10.

An insulating film 12 is formed covering a top surface of the gate electrode 5A, the sidewall 10, and the diffusion layer 8A therewith. The insulating film 12 terminates at a point intermediate between the gate oxide film 4 and the field oxide film 2. Similarly, the insulating film 12 is formed covering the gate electrode 5B, the sidewall 10, and the diffusion layer 6A therewith. The insulating film 12 terminates at a point intermediate between the gate oxide film 4 and the field oxide film 2. A partial silicide layer 13B is formed on the diffusion layers 6A and 9A, respectively, where the insulating film 12 is not formed. The diffusion layers 7A and 8A are entirely covered thereon with a silicide layer 13A.

The semiconductor substrate 1 is entirely covered with an interlayer insulating film 16. The interlayer insulating film 16 is formed with a plurality of contact holes, which are filled with metal to thereby form electrodes 15A, 15B and 15C. The electrode 15A makes contact with the silicide layer 14A through an area 14A comprising a plurality of squares in line, as illustrated in FIG. 4. Similarly, the electrodes 15B and 15C make contact with the silicide layers 13B and 13A, respectively, through areas 14B, 14C and 14D each comprising a plurality of squares in line.

The electrode 15A is in electrical connection with a ground line GND. The electrode 15B is in electrical connection with an output terminal OUT, and the electrode 15C is in electrical connection with a power source line Vdd.

In the instant embodiment, there are formed silicide layers 13A on the source regions 7A and 8A of PMOS and NMOS transistors, extending from the sidewall insulating film 10 formed at a side surface of the gate electrodes 5A and 5B to the field oxide film 2. In contrast, the silicide layer 13B is not formed entirely on a surface of the drain regions 6A and 9A. Specifically, the silicon layer 13B extends from a point remote from the sidewall insulating film 10 to the field oxide film 2. More specifically, the silicide layer 13B is formed on the diffusion layers 6A and 9A at least around the areas 14B and 14C through which the electrode 15B makes contact with the silicide layer 13B. Accordingly, since there does not exist a silicide layer on a part of a surface of the diffusion layers, in particular, in the vicinity of surfaces of the LDD layers 6B and 9B, it would be possible to maintain a layer resistance of the diffusion layers.

When static electricity is applied through the electrode 15B, a voltage drop occurs in the diffusion layers 6A and 9A until the voltage reaches the LDD layers 6B and 9B through the contact areas 14B and 14C, and as a result, a potential in the diffusion layers is raised. Hence, as soon as the parasitic bipolar transistor Tr1 defined by the LDD layers 6B and 9B is turned on, the subsequent parasitic bipolar transistors Tr2 to Trx are also turned on. Accordingly, a current is not concentrated into the LDD layers 6B and 9B, which ensures to avoid destruction of a transistor defined by the LDD layers 6B and 9B. As a result, a higher ESD immunity is obtained.

Since no silicide layer is not formed on the diffusion layers 6A and 9A, but the partial silicide layer 13B is formed, it would be possible to decrease a contact resistance between the electrode 15B and the diffusion layers 6B, 9B to thereby minimize the reduction in the driving ability of the output transistor. In the instant embodiment, the partial silicide layer 13B is formed extending to the field insulating film 2, but it should be noted that the partial silicide layer 13B is required to cover at least the contact areas 14B and 14C through which the electrode 15B make contact with the diffusion layers 6A and 9A. It is not always necessary for the partial silicide layer 13B to extend to the field oxide layer 2.

On the other hand, the silicide layer 13A entirely covers the source diffusion layers 7A and 8A therewith in PMOS and NMOS transistors. This is for avoiding an increase in a layer resistance, and also for minimizing the reduction in the driving ability of the output transistor.

Preferred element dimensions in the instant embodiment are explained hereinbelow with reference to FIG. 4. FIG. 4 is a top plan view illustrating the output transistor illustrated in FIG. 3. Parts or elements in FIG. 4 corresponding to those in FIG. 3 have been provided with the same reference numerals. Small letters a to e indicate a length of each of the elements in NMOS transistor. Specifically, the small letters a to e indicate the following length of the associated element:

"a" indicates a length of the source diffusion layer 8A, and is equal to 3 $\mu$m;

"b" indicates a length of the gate electrode 5A, namely a gate width, and is equal to 0.6 $\mu$m;

"c" indicates a length of the drain diffusion layer 9A, and is equal to 3 $\mu$m;

"d" indicates a length of the partial silicide layer 13B, and is equal to 1 $\mu$m; and "e" indicates a length of the contact areas 14A to 14D, and is equal to 0.5 $\mu$m.

Accordingly, the partial silicide layer 13B covers the drain diffusion layers 6A and 9A by about one third (d/c=⅓). The dimensions of each of the elements in PMOS transistor are the same as those in NMOS transistor, but may be slightly varied taking a difference in driving ability between PMOS and NMOS transistors into consideration.

Hereinbelow is explained a relation between the driving ability and the dimensions of the elements in both a conventional output transistor and the output transistor in accordance with the present embodiment. This is based on the results of evaluation for the ESD immunity. In this evaluation, there were formed the following three transistors having the above mentioned dimensions, and the ESD immunity and the driving ability were evaluated.

1. MOS transistor including a silicide layer formed entirely on diffusion layers (the transistor illustrated in FIG. 2)
2. MOS transistor having no silicide layer on diffusion layers (a conventional transistor)
3. MOS transistor in accordance with the invention (the transistor illustrated in FIG. 3)

It was confirmed that the transistors Nos. 2 and 3 had a desired ESD immunity of +4000V and −4000V, but that the transistor No. 1 had a ESD immunity of merely +1000V and −4000V.

Hereinbelow is explained a comparison between the driving ability and the dimensions of the elements in each of the MOS transistors Nos. 1 to 3. Herein, suppose that the transistor No. 1 has a driving ability which an output transistor is expected to have, and such driving ability is indicated with one (1). As a result of the evaluation, the transistor No. 2 has a driving ability about 20% smaller than that of the transistor No. 1. Hence, the driving ability of the transistor No. 2 is indicated with 0.8. The transistor No. 3 has a driving ability about 5% smaller than that of the transistor No. 1. Hence, the driving ability of the transistor No. 3 is indicated with 0.95.

Hence, if the MOS transistors Nos. 1 to 3 are designed to have a common driving ability, each of the MOS transistors would have to have an area as follows. Herein, suppose that MOS transistor No. 1 has a standard area, and a gate length of MOS transistor No. 1 is 400 $\mu$m.

1. An area of MOS transistor No. 1 (a+b+c)×(gate length)=6.6×400=2640 $\mu m^2$.
2. An area of MOS transistor No. 2=2640×(1/0.8)=3300 $\mu m^2$.

This means that MOS transistor No. 2 has an area 25% greater than that of MOS transistor No. 1.
3. An area of MOS transistor No. 3=2640×(1/0.95)≈2780 $\mu m^2$.

This means that MOS transistor No. 3 has an area 5% greater than that of MOS transistor No. 1.

As is obvious from the calculation, when output transistors having a common driving ability are to be made, an output transistor having a partial silicide layer, which corresponds to the above mentioned MOS transistor No.3, has an area about 16% smaller than that of an output transistor having no silicide layer, which corresponds to the above mentioned MOS transistor No. 2.

$$(3300-2780) \div 3300 \approx 0.16$$

If the partial silicide layer is made smaller in length for enhancing the ESD immunity, MOS transistor No. 3 would have a driving ability about 10% smaller than that of MOS transistor No. 1, but have an area about 11% smaller than that of MOS transistor No. 2. Thus, the instant embodiment or MOS transistor No. 3 provides an advantageous effect of reducing an area of a transistor by about 10% or more.

A method of fabricating an output transistor in accordance with the instant embodiment is explained hereinbelow with reference to FIGS. 5A to 5E. The method explained hereinbelow makes it possible to form an output transistor and an internal circuit of a semiconductor device in common steps.

Figure 5A:
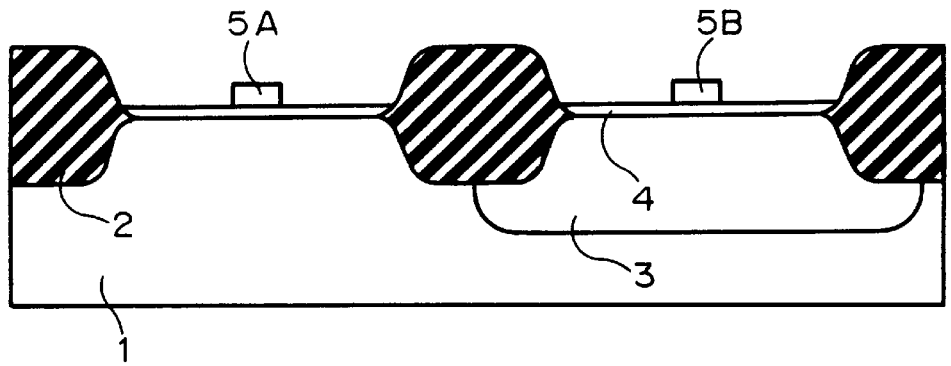
FIGS. 5A to 5E are cross-sectional views of MOS transistor, illustrating respective steps of a method of fabricating the same in accordance with the present invention.

As illustrated in FIG. 5A, there are formed the field oxide film 2 at a surface of a p-type silicon substrate 1. Then, the n-type well 3 is formed in the silicon substrate 1. Then, the gate insulating film 4 is formed covering a surface of the silicon substrate 1. Then, the gate electrodes 5A and 5B are formed on the gate insulating film 4 in a conventional way.

Figure 5B:
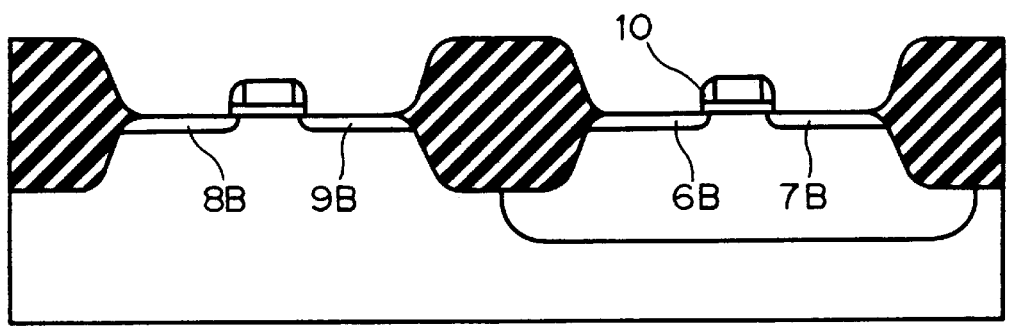

Then, a photoresist mask is made for formation of LDD diffusion layers. Then, a region where PMOS transistor is to be formed is ion-implanted with boron to thereby form the p− diffusion layers 6B and 7B, and a region where NMOS transistor is to be formed is ion-implanted with phosphorus to thereby form the n− diffusion layers 8B and 9B, as illustrated in FIG. 5B. Then, the sidewall insulating film 10 is formed on a sidewall of the gate electrodes 5A and 5B.

Figure 5C:
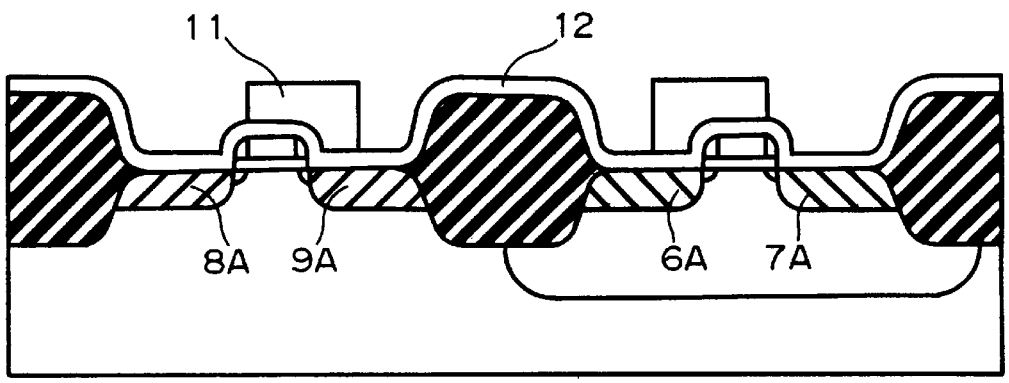

Then, a photoresist mask is made again. The region where PMOS transistor is to be formed is ion-implanted with boron having high concentration, and the region where NMOS transistor is to be formed is ion-implanted with arsenic having high concentration, followed by annealing for activation, to thereby form the p+ diffusion layers 6A, 7A and the n+ diffusion layers 8A, 9A. Then, the insulating film 12 such as $SiO_2$ film and $Si_3N_4$ film is made grown all over a resultant by about 500 angstroms by chemical vapor deposition (CVD). Then, as illustrated in FIG. 5C, a photoresist film 11 is formed in selected areas where a silicide layer is not to be formed.

Figure 5D:
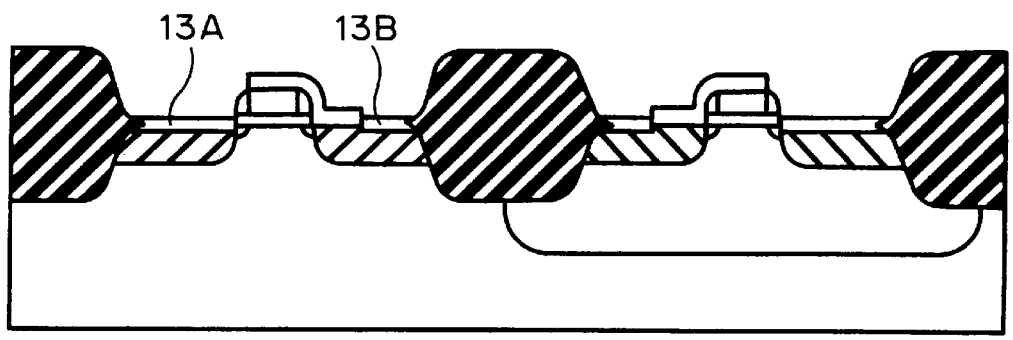

Then, the insulating film 12 is etched by reactive ion etching (RIE) where it is not covered with the photoresist film 11. Thereafter, the photoresist film 11 is removed. Then, titanium (Ti) or cobalt (Co) is deposited on a resultant by sputtering, followed by annealing to thereby make silicide reaction take place. Then, the thus produced silicide is etched in selected areas by a mixture solution of $H_2O_2$ and $H_2SO_4$, to thereby form the silicide layer 13A on the diffusion layers 7A and 8A and also form the partial silicide layer 13B on the diffusion layers 6A and 9A, as illustrated in FIG. 5D. When the gate electrodes 5A and 5B are made of polysilicon, the photoresist film 11 may be formed in such areas that the silicide layers are formed simultaneously with the gate electrodes.

Figure 5E:
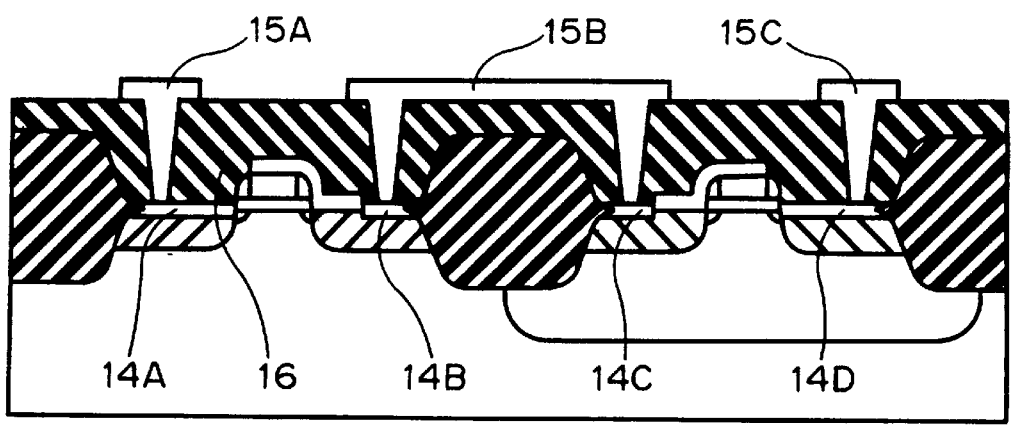

Then, the interlayer insulating film 16 is formed over a resultant. Then, contact holes are made throughout the interlayer insulating film 16 to the silicide layers 13A and 13B. Then, the contact holes are filled with metal such as aluminum, for instance, by sputtering to thereby form the electrodes 15A, 15B and 15C. The thus formed electrodes 15A to 15C make contact with the silicide layers 13A and 13B through contact areas 14A to 14D illustrated in FIG. 4. Thus, there is completed an output transistor, as illustrated in FIG. 5E.

In the above mentioned embodiment, an output transistor is described as an example. However, those skilled in the art would readily understand that the invention may be applied to an input transistor.

In accordance with the invention having been explained with reference to the preferred embodiment, a silicide layer is formed only in the vicinity of a contact area through which the electrode terminal makes contact with the drain region, it is possible to construct an output transistor in LDD structure. Thus, there can be obtained an output transistor having higher ESD immunity, higher driving ability, and higher integration. In particular, comparing to a conventional output transistor having the same driving ability, but not having a silicide layer, it could be possible to reduce a device area by 10% or more, ensuring avoidance from an increase in fabrication cost caused by increased chip size.

In accordance with the method of fabricating a semiconductor device, an output transistor is able to be formed together with an internal circuit in common steps except a step of forming an insulating film for masking a part of a drain region of the output transistor. As a result, it is possible to eliminate laborious steps of separately forming an internal circuit from an output circuit, which ensures enhancement in a fabrication yield of a semiconductor device.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-223766 filed on Aug. 26, 1996 including specification, claims, drawings and summary is incorporated herein by reference in its entirety.

What is claimed is:

1. A method of fabricating a semiconductor device including an internal transistor and one of input and output transistors, comprising the steps of:
   (a) simultaneously forming both said internal transistor and said one of input and output transistors, each of said transistors including a source region, a drain region, and a gate electrode formed between said source and drain regions in electrical insulation; and
   (b) forming a silicide layer partially covering one of said source and drain regions of said one of input and output transistors, and entirely covering both the other of said source and drain regions of said one of input and output transistors and said source and drain regions of said internal transistor.

2. The method as set forth in claim 1, further comprising the step of (c) forming an insulating film extending from said gate electrode and partially covering said one of said source and drain regions of said one of input and output transistors therewith, said step (c) being carried out between said steps (a) and (b).

3. A method of fabricating a semiconductor device including an internal transistor and one of input and output transistors, comprising the steps of:
   (a) simultaneously forming both said internal transistor and said one of input and output transistors, each of said transistors including a source region, a drain region, and a gate electrode formed between said source and drain regions in electrical insulation;
   (b) forming a silicide layer partially covering one of said source and drain regions of said one of input and output transistors, and entirely covering both the other of said source and drain regions of said one of input and output transistors and said source and drain regions of said internal transistor; and
   (c) forming an electrode terminal making contact with said silicide layer, said silicide layer extending so that it covers at least an area through which said electrode terminal makes contact with said drain region.

4. The method as set forth in claim 3, further comprising the step of (d) forming an insulating film extending from said gate electrode and partially covering said one of said source and drain regions of said one of input and output transistors therewith, said silicide layer being formed extending from an end of said insulating film, said step (d) being carried out between said steps (a) and (b).

* * * * *